United States Patent
Takaoka et al.

(10) Patent No.: US 6,680,460 B1
(45) Date of Patent: Jan. 20, 2004

(54) APPARATUS FOR PRODUCING A SEMICONDUCTOR THIN FILM

(75) Inventors: Hiromichi Takaoka, Tokyo (JP); Tomoyuki Akashi, Kanagawa (JP)

(73) Assignees: NEC Corporation, Tokyo (JP); Sumitomo Heavy Industries, Ltd., Tokyo (JP)

( * ) Notice: Subject to any disclaimer, the term of this patent is extended or adjusted under 35 U.S.C. 154(b) by 160 days.

(21) Appl. No.: 09/639,471

(22) Filed: Aug. 16, 2000

(30) Foreign Application Priority Data

Aug. 16, 1999 (JP) ............................................. 11-230034

(51) Int. Cl.[7] ............................................. B23K 26/06
(52) U.S. Cl. ................................................ 219/121.73
(58) Field of Search ....................... 219/121.73, 121.68, 219/121.65, 121.74; 430/5

(56) References Cited

U.S. PATENT DOCUMENTS

| | | | |
|---|---|---|---|
| 4,031,351 A | | 6/1977 | Martin |
| 4,316,074 A | | 2/1982 | Daly |
| 4,439,245 A | * | 3/1984 | Wu |
| 4,856,019 A | * | 8/1989 | Miyata et al. |
| 5,142,120 A | * | 8/1992 | Hanson et al. |
| 5,223,693 A | * | 6/1993 | Zumoto et al. ........ 219/121.73 |
| 5,490,896 A | * | 2/1996 | Yagi et al. ...................... 430/5 |
| 5,585,019 A | * | 12/1996 | Gu et al. ................ 219/121.73 |
| 5,756,236 A | * | 5/1998 | Cordes et al. .................. 430/5 |
| 5,869,803 A | * | 2/1999 | Noguchi et al. ....... 219/121.74 |
| 5,938,839 A | * | 8/1999 | Zhang |
| 6,203,952 B1 | * | 3/2001 | O'Brien et al. |

FOREIGN PATENT DOCUMENTS

| | | |
|---|---|---|
| EP | 0 458 181 A | 11/1991 |
| JP | S57-026445 | 2/1982 |
| JP | S57-181537 | 11/1982 |
| JP | S62-277727 | 12/1987 |
| JP | H01-259530 | 10/1989 |
| JP | 03 101226 A | 4/1991 |
| JP | H03-210987 | 9/1991 |
| JP | 4-370925 | 12/1992 |
| JP | H05-277776 | 10/1993 |
| JP | H06-104196 | 4/1994 |
| JP | 7-24590 A * | 1/1995 |
| JP | H07-124777 | 5/1995 |
| JP | H10-003162 | 1/1998 |
| JP | 2001-023918 | 1/2001 |

OTHER PUBLICATIONS

Sposili et al., "Sequential lateral solidification of thin silicon films on $SiO_2$", *Appl. Phys. Lett.*, vol. 69, No. 19, Nov. 4, 1996, pp. 2864–2866.

* cited by examiner

*Primary Examiner*—Geoffrey S. Evans
(74) *Attorney, Agent, or Firm*—Sughrue Mion, PLLC (57) ABSTRACT

In a semiconductor thin film producing apparatus for irradiating a semiconductor thin film by a laser beam through an aperture pattern formed in a mask to reform the semiconductor thin film, the mask has a reflecting surface having a reflectance not smaller than 70% with respect to the laser beam. An absorbing substrate is arranged at a position before the laser beam is irradiated onto the mask. The absorbing substrate is for locally absorbing the laser beam and is for absorbing a reflected beam which is reflected by the reflecting surface of the mask when the laser beam is irradiated onto the reflecting surface of the mask.

20 Claims, 5 Drawing Sheets

APPARATUS FOR PRODUCING A SEMICONDUCTOR THIN FILM

BACKGROUND OF THE INVENTION

This invention relates to a semiconductor thin film producing apparatus used in a crystallizing process of crystallizing a semiconductor material and, in particular, to a laser annealing apparatus used in a production process of a liquid crystal display or a contact image sensor.

In a crystallizing process of crystallizing an amorphous silicon film deposited on a substrate (for example, a glass substrate), use has widely been made of a laser annealing technique utilizing an excimer laser. This is because, by the use of the excimer laser, the crystallizing process can be performed with the substrate kept at a relatively low temperature. The excimer laser produces a laser beam having high energy sufficient to melt and crystallize amorphous silicon. The laser beam produced by the excimer laser has a very small pulse width on the order of several tens nanoseconds so that crystallization is quickly completed within a time period on the order of one hundred nanoseconds. Therefore, the heat produced by the laser beam is not transferred to the substrate. Thus, the crystallizing process can be carried out without exposing the substrate to a high temperature.

Figure 1:
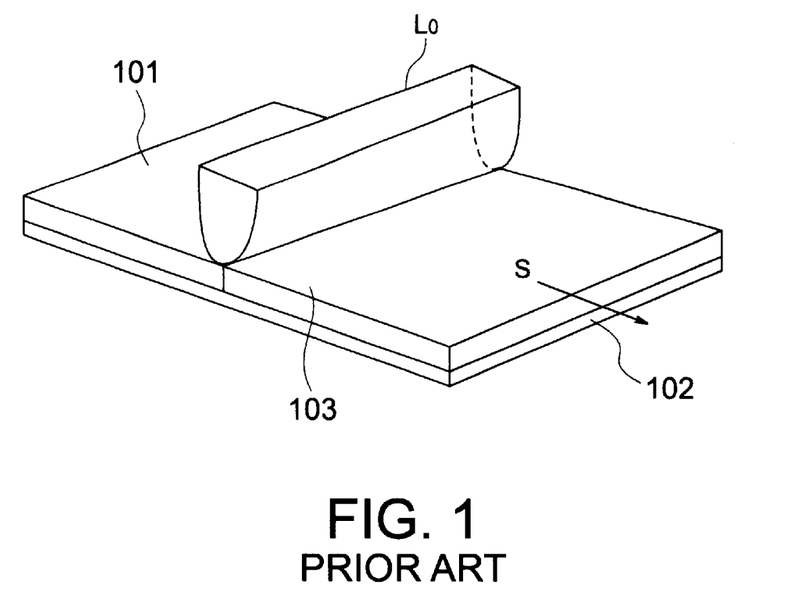
FIG. 1 schematically shows a long beam used in an existing technique.

Referring to FIG. 1, a conventional laser annealing technique uses a laser beam $L_O$ having a beam profile illustrated in the figure. The laser beam $L_O$ is called a long beam or a line beam. By the use of the laser beam $L_O$ continuously irradiated in a scanning direction S, an amorphous silicon film 101 deposited on an insulating substrate 102 is crystallized into a polycrystalline silicon film 103. However, the polycrystalline silicon film 103 produced in the above-mentioned manner is composed of crystal grains having a very small grain size on the order of several hundreds nanometers at maximum. Therefore, a large number of grain boundaries are present in the polycrystalline silicon film 103. Since the grain boundaries prevent the conduction of charge carriers, presence of such a large number of grain boundaries reduces the mobility of thin film transistors (TFT). As a result, it is impossible to produce an active matrix liquid crystal display (AMLCD) having a high response speed.

In view of the above, it is desired to produce a polycrystalline silicon film composed of crystal grains of a large size with a reduced number of grain boundaries. To this end, a crystallizing process using a projection mask is proposed by James S. Im et al in Applied Physics Letters 69(19), Nov. 4, 1996, p. 2864.

Figure 2:
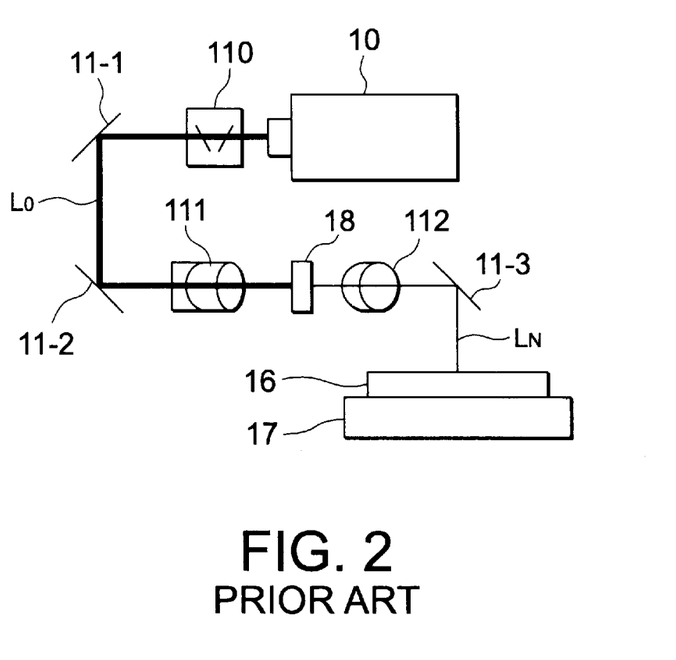
FIG. 2 schematically shows a conventional semiconductor thin film producing apparatus.

Referring to FIG. 2, the Im et al crystallizing process will be described.

The im et al crystallizing process utilizing a laser annealing technique is implemented by an apparatus illustrated in FIG. 2. A laser oscillator 10 emits a laser beam $L_O$. The laser beam $L_O$ is attenuated by an attenuator 110 and reflected by first and second total reflection mirrors 11-1 and 11-2. After passing through a field lens 111, the laser beam $L_O$ is shaped by a projection mask 18 into a narrow beam $L_N$ having a beam width on the order of 5 μm in accordance with a mask pattern formed on the projection mask 18. The narrow beam $L_N$ passes through an image-forming lens 112 and reflected by a third total reflection lens 11-3 to be irradiated onto a substrate 16 supported on a substrate stage 17. On the substrate 16, an amorphous silicon film (not shown) is preliminarily deposited. After a single step of irradiation, the substrate 16 is displaced by moving the substrate stage 17 and another step of irradiation is carried out. By repeating the above-mentioned operation, the substrate 16 is scanned throughout its entire surface and the crystal growth takes place in the amorphous silicon film deposited on the substrate 16. Herein, the substrate 16 is scanned at a scanning pitch on the order of 0.75 μm.

In the Im et al crystallizing process described above, the distance of the crystal growth in each single step of laser irradiation is so short that the substrate must be scanned at such a narrow pitch. Every time when the substrate is scanned, the laser beam is irradiated with high energy sufficient to melt amorphous silicon. This imposes a heavy load upon the projection mask. Upon irradiation of the laser beam, the projection mask absorbs the energy of the laser beam to be heated to an extremely high temperature. This results in occurrence of distortion of the mask pattern and ablation of a film. In this event, the projection mask can not be used any longer. In order to avoid the above-mentioned problem, the projection mask must be made of a material having a high reflectance so as not to substantially absorb the energy of the laser beam.

In a current lithography process for producing a large scale integrated circuit (LSI), use is often made of a stepper or an exposure apparatus comprising an excimer laser such as KrF and ArF as a light source. Generally, the stepper uses a reticle made of Cr as a mask material. The reflectance of Cr with respect to an ultraviolet ray is as low as about 60%. Therefore, such reticle can be used in the stepper without any disadvantage as far as the laser beam has low energy per pulse. However, in the above-mentioned crystallizing process using a high-energy laser beam, such reticle is not applicable because heat generation resulting from energy absorption is seriously great.

SUMMARY OF THE INVENTION

It is therefore an object of this invention to provide a semiconductor thin film producing apparatus for irradiating a semiconductor thin film with a laser beam corresponding to an aperture pattern formed in a mask to reform the semiconductor thin film, in which the mask is enhanced in durability and prolonged in life to reduce the frequency of exchange from one mask to another mask so that a high productivity is achieved.

This invention achieves a mask enhanced in durability and prolonged in life to reduce the frequency of exchange from one mask to another mask in a process of reforming a semiconductor thin film by a large number of times of irradiation of a high-energy excimer laser beam.

According to a first aspect of this invention, there is provided a semiconductor thin film producing apparatus for irradiating a semiconductor thin film by a laser beam through an aperture pattern formed in a mask to reform the semiconductor thin film, wherein the mask has a reflecting surface having a reflectance not smaller than 70% with respect to the laser beam.

Thus, it is possible to achieve a mask highly durable against a high-energy excimer laser beam.

According to a second aspect of this invention, the apparatus further comprises a cooling mechanism for cooling the mask.

By cooling the mask with water or liquid nitrogen, the increase in temperature of the mask is suppressed to further enhance the durability of the mask.

According to a third aspect of this invention, the mask comprises a substrate material and a mask material formed on the substrate material. The mask material has the aperture pattern and the reflecting surface having the reflectance not smaller than 70% with respect to the laser beam. The substrate material transmits to the semiconductor thin film the laser beam which is transmitted through the aperture pattern formed in the mask material.

By depositing the mask material as a thin film on the substrate material transmitting the laser beam, it is possible to achieve a fine structure as the aperture pattern formed on the mask.

According to a fourth aspect of this invention, the mask further comprises a transmitting film formed on the substrate material with the mask material interposed between the substrate material and the transmitting film.

The transmitting film serves to protect the mask by suppressing oxidization and ablation of the mask material.

According to a fifth aspect of this invention, the semiconductor thin film producing apparatus further comprises at least one absorbing substrate arranged at a position before the laser beam is irradiated onto the mask. The above-mentioned at least one absorbing substrate is for locally absorbing the laser beam.

According to a sixth aspect of this invention, the above-mentioned at least one absorbing substrate is furthermore for absorbing a reflected beam which is reflected by the reflecting surface of the mask when the laser beam is irradiated onto the reflecting surface of the mask.

By providing the absorbing substrate for absorbing the laser beam, it is possible to suppress a damage caused by a reflected beam reflected by the mask to an optical system, for example, comprising a homogenizer If providing a plurality of absorbing substrate for absorbing the laser beam, the energy of the laser beam absorbed by each absorbing substrate and the heat generation in each absorbing substrate are reduced to thereby enhance the durability of the absorbing substrate.

According to a seventh aspect of this invention, the semiconductor thin film producing apparatus further comprises a reflecting substrate arranged at a position before the laser beam is irradiated onto the mask to be in anti-parallel to the mask. The reflecting substrate has a reflecting surface having a reflectance of 70% or more with respect to the laser beam for locally reflecting the laser beam as a reflected beam when the laser beam is irradiated onto the reflecting surface of the reflecting substrate.

By provision of the reflecting substrate, it is possible to suppress a damage caused by a reflected light beam reflected by the mask to an optical system, for example, comprising a homogenizer.

According to an eighth aspect of this invention, the semiconductor thin film producing apparatus further comprises a mechanism for returning the reflected beam to an optical path of the laser beam.

With this structure, repeated irradiation can be carried out at time intervals without using a plurality of laser oscillators.

According to a ninth aspect of this invention, the semiconductor thin film producing apparatus further comprises an optical system arranged in a return route through which the reflected beam is returned to the optical path.

With this structure, it is possible to trim the profile of the reflected light beam.

According to a tenth aspect of this invention, the semiconductor thin film producing apparatus further comprises a mechanism for freely changing the length of a return route through which the reflected beam is returned to the optical path.

With this structure, it is possible to freely change the distance over which the reflected light beam travels before it is irradiated onto the substrate and to freely select the time required before the reflected light beam is irradiated onto the substrate.

Table 1 shows the reflectance (%) of each of an Al film and a Cr film with respect to an ultraviolet ray.

TABLE 1

| Wavelength of   | Reflectance (%) | |
|---|---|---|
| Ultraviolet Ray | Al film | Cr film |
| 351 nm | 82.9 | 63.1 |
| 308 nm | 81.3 | 61.3 |

As seen from Table 1, it is understood that the Al film has a reflectance greater than 80% while the Cr film has a reflectance smaller than 70%. A high reflectance results in low absorption, i.e., less temperature increase. Therefore, it is believed that Al is higher in durability than Cr. Herein, each metal film was deposited by sputtering to the thickness of 200 nm.

The Ar film and the Cr film were subjected to an irradiation durability test in which these films were continuously irradiated by a laser beam emitted from a XeCl excimer laser and having a wavelength of 308 nm. The results are shown in Tables 2A and 2B.

TABLE 2A

| | Results of Irradiation Durability Test (100 times of irradiation) | | | |
|---|---|---|---|---|
| Energy of | Al film | | Cr film | |
| Laser Beam | 5 Hz | 100 Hz | 5 Hz | 100 Hz |
| 50 mJ/cm$^2$ | ○ | ○ | ○ | ○ |
| 100 mJ/cm$^2$ | ○ | ○ | ○ | ○ |
| 150 mJ/cm$^2$ | ○ | ○ | ○ | ○ |
| 200 mJ/cm$^2$ | ○ | ○ | □ | □ |
| 250 mJ/cm$^2$ | □ | □ | x | x |
| 300 mJ/cm$^2$ | Δ | Δ | x | x |
| 400 mJ/cm$^2$ | Δ | Δ | x | x |
| 500 mJ/cm$^2$ | Δ | Δ | x | x |
| 600 mJ/cm$^2$ | Δ | Δ | x | x |

TABLE 2B

| | Results of Irradiation Durability Test (600,000 times of irradiation) | |
|---|---|---|
| Energy of Laser Beam | Al film 100 Hz | Cr film 150 Hz |
| 50 mJ/cm$^2$ | ○ | ○ |
| 100 mJ/cm$^2$ | ○ | x |
| 150 mJ/cm$^2$ | x | |

In Tables 2A and 2B, symbols ○, □, Δ, and x represent "no change in appearance", "slight discoloration", "clear discoloration observed but not completely detached (not seen through)", and "clear discoloration observed and detached (seen through)", respectively.

Table 2A and 2B show results of the irradiation durability test in which the films were subjected to irradiation of 100 times and 600,000 times, respectively.

From the results given above, it is understood that the Al film hardly causes discoloration and detachment as compared with the Cr film, and is durable up to 600,000 times of irradiation at the energy of 100 mJ/cm$^2$. By concentrating the laser beam using a reduction projecting lens, the semiconductor film can sufficiently be reformed at the laser beam intensities shown in Tables 2A and 2B.

DESCRIPTION OF THE PREFERRED EMBODIMENTS

Now, description will be made of several preferred embodiments of this invention with reference to the drawing.

First Embodiment

Figure 3:
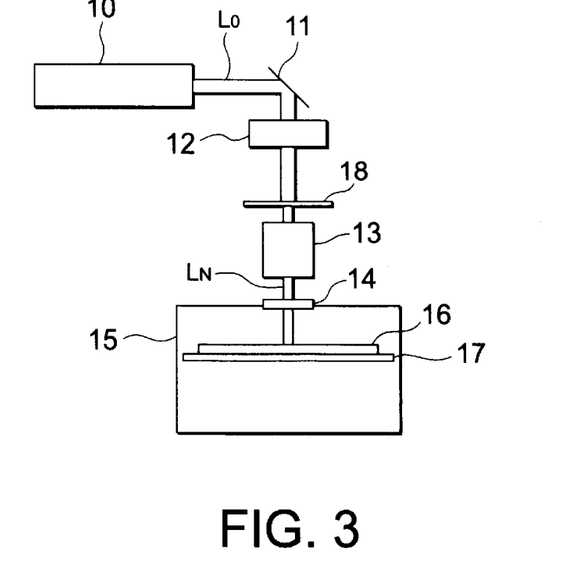
FIG. 3 schematically shows a semiconductor thin film producing apparatus according to a first embodiment of this invention.

At first referring to FIGS. 3 through 5, a semiconductor thin film producing apparatus according to a first embodiment of this invention will be described. As illustrated in FIG. 3, the apparatus comprises an excimer laser oscillator 10, a total reflection mirror 11, an optical system 12, a projection lens 13, a window 14, and a process chamber 15. In the process chamber 15, a substrate 16 is supported on a substrate stage 17. Between the optical system 12 and the projection lens 13, a projection mask 18 is arranged.

The laser oscillator 10 emits a laser beam $L_O$. The laser beam $L_O$ passes through the total reflection mirror 11 and the optical system 12 to reach the projection mask 18. In accordance with a mask pattern or aperture pattern formed on the projection mask 18, the laser beam $L_O$ is shaped into a narrow beam $L_N$. The narrow beam $L_N$ is reduction-projected by the projection lens 13 and irradiated through the window 14 onto the substrate 16 held in the process chamber 15. The substrate stage 17 is controllably changed in its position so as to freely determine an irradiation area of the substrate 16 supported thereon.

Figure 4:
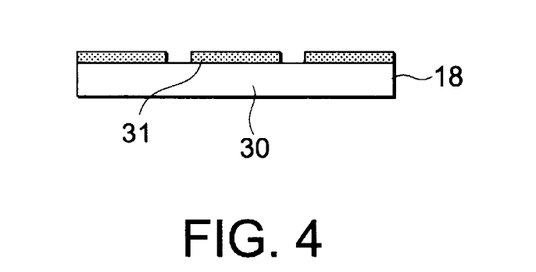
FIG. 4 is a sectional view of a projection mask used in the apparatus illustrated in FIG. 3.

Referring to FIG. 4, the projection mask 18 comprises a quartz substrate 30 and a metal film 31 formed thereon. The metal film 31 has a surface reflectance of 70% or more with respect to the laser beam used. The metal film 31 is provided with the above-mentioned mask pattern. Alternatively, use may be made of a patterned metal substrate. It is noted here that the mask pattern formed on the metal film 31 may comprise not only a linear pattern but also any other shape. The size and the shape may be different.

Figure 5:
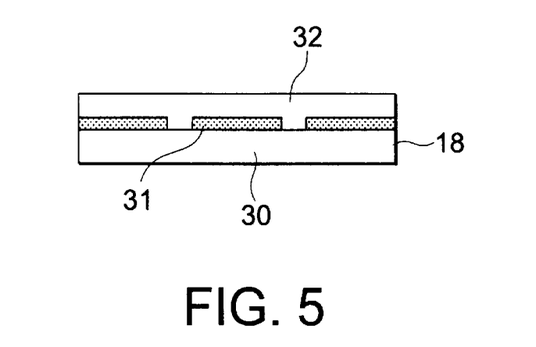
FIG. 5 is a sectional view of a modified projection mask having a protection film.

Referring to FIG. 5, the projection mask 18 may further comprise at least one protection film 32. The projection mask 18 may be provided with a mechanism for suppressing an increase in temperature by the use of water or liquid nitrogen.

Second Embodiment

Next referring to FIGS. 6 and 7, a semiconductor thin film producing apparatus according to a second embodiment will be described. This embodiment is basically similar in structure to the first embodiment except that an absorption mask 19 is interposed between the optical system 12 and the projection mask 18.

Figure 6:
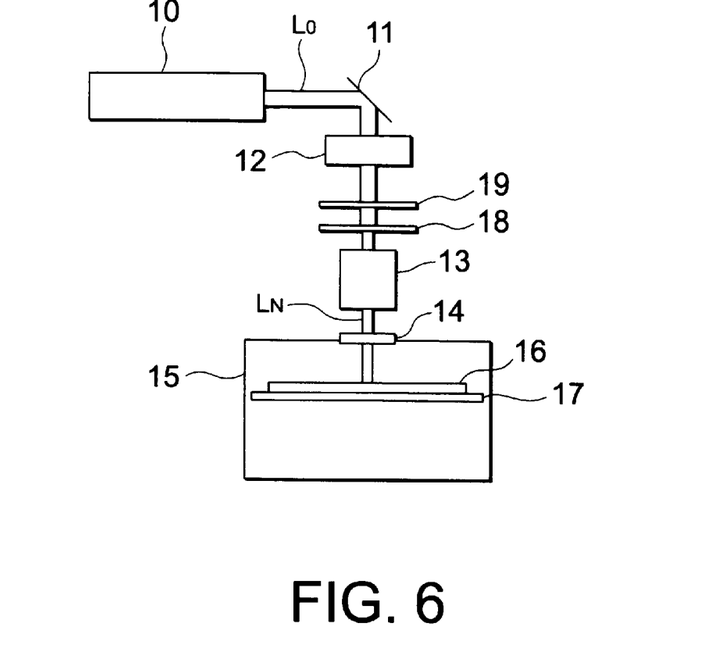
FIG. 6 schematically shows a semiconductor thin film producing apparatus according to a second embodiment of this invention.

As illustrated in FIG. 6, the laser beam $L_O$ emitted from the excimer laser oscillator 10 passes through the total reflection mirror 11 and the optical system 12 to reach the projection mask 18. In accordance with the mask pattern formed on the projection mask 18, the laser beam $L_O$ is shaped into the narrow beam $L_N$. The narrow beam $L_N$ is reduction-projected by the projection lens 13 and irradiated through the window 14 onto the substrate 16 held in the process chamber 15. Thus, the operation is substantially similar to that of the first embodiment illustrated in FIG. 3. In this embodiment, the absorption mask 19 interposed between the optical system 12 and the projection mask 18 serves to suppress production of a reflected light beam reflected by the projection mask 18 and returning to the optical system 12.

Figure 7:
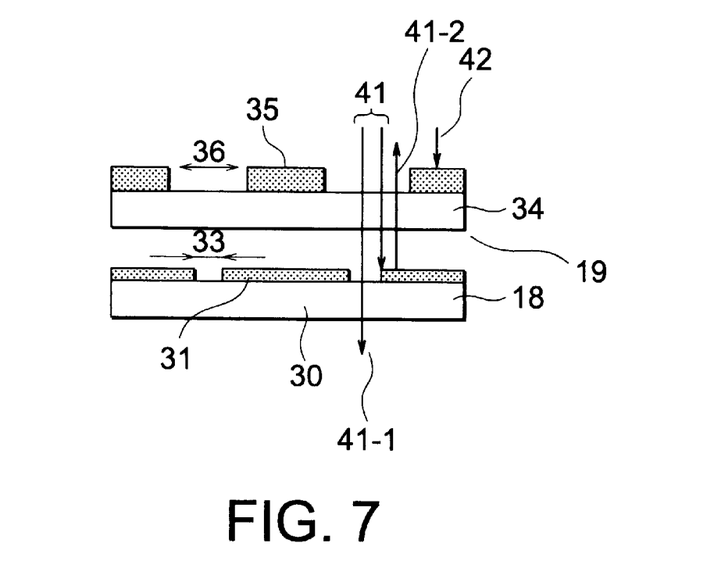
FIG. 7 is a sectional view of a projection mask and an absorption mask used in the apparatus illustrated in FIG. 6.

Referring to FIG. 7, the absorption mask 19 comprises a mask substrate 34 and an absorption film 35 deposited thereon. The mask substrate 34 is made of a material, such as quartz glass, which transmits the laser beam. The absorption film is made of a material which absorbs the laser beam. The absorption film 35 is patterned to form a plurality of apertures 36. Alternatively, the absorption mask 19 may comprise a patterned mask substrate made of a material which absorbs the laser beam.

Referring to FIG. 7, the projection mask 18 and the absorption mask 19 are arranged in parallel to each other. When the laser beam $L_O$ is incident to the absorption mask 19, a part of the laser beam $L_O$ is transmitted through the aperture 36 of the absorption mask 19 towards the projection mask 18 as a transmitted laser beam 41 while the other part of the laser beam $L_O$ is absorbed by the absorption film 35 of the absorption mask 19 as an absorbed laser beam 42. The transmitted laser beam 41 is transmitted through an aperture 33 of the projection mask 18 towards the projection lens 13 as a passing laser beam 41-1 on one hand, and is reflected by the metal film 31 of the projection mask 18 as a reflected laser beam 41-2 to return to the optical system 12 on the other hand. Each aperture 36 of the absorption mask 19 has a size such that the passing laser beam 41-1 is not substantially influenced by scattering and reflection at an end of the absorption film 35 and that production of the reflected light beam 41-2 is minimized.

It is noted here that use may be made of a plurality of absorption masks. The absorption mask 19 may comprise a mechanism for suppressing an increase in temperature of the absorption mask 19 by the use of water or liquid nitrogen.

Third Embodiment

Next referring to FIGS. 8 and 9, a semiconductor thin film producing apparatus according to a third embodiment of this invention will be described. The apparatus of this embodiment is similar in structure to that of the second embodiment except that the absorption mask 19 is replaced by a reflection mask 20.

Figure 8:
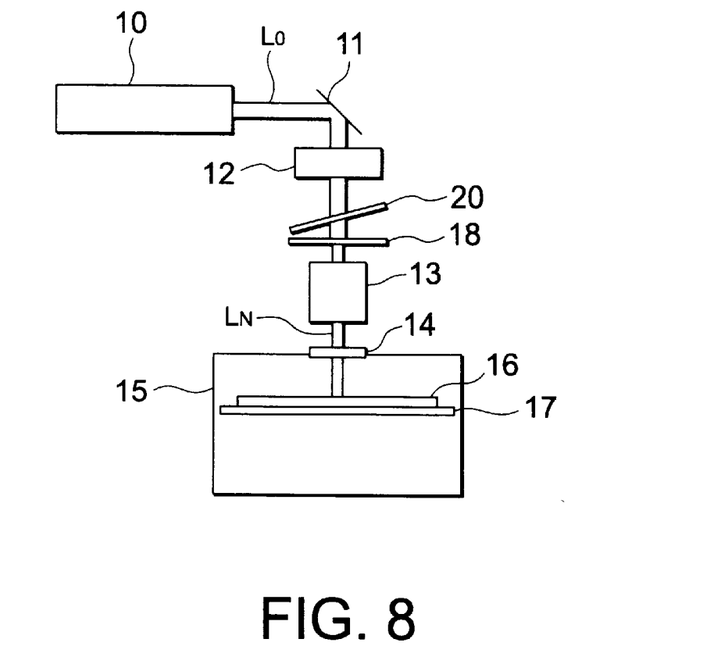
FIG. 8 schematically shows a semiconductor thin film producing apparatus according to a third embodiment of this invention.

As illustrated in FIG. 8, the laser beam $L_O$ emitted from the excimer laser oscillator 10 passes through the total reflection mirror 11 and the optical system 12 to reach the projection mask 18. In accordance with the mask pattern formed on the projection mask 18, the laser beam $L_O$ is shaped into the narrow beam $L_N$. The narrow beam $L_N$ is reduction-projected by the projection lens 13 and irradiated through the window 14 onto the substrate 16 held in the process chamber 15. Thus, the operation is substantially similar to that of the first embodiment illustrated in FIG. 3. In this embodiment, the reflection mask 20 interposed between the optical system 12 and the projection mask 18 serves to suppress production of the reflected light beam reflected by the projection mask 18 and returning to the optical system 12.

Figure 9:
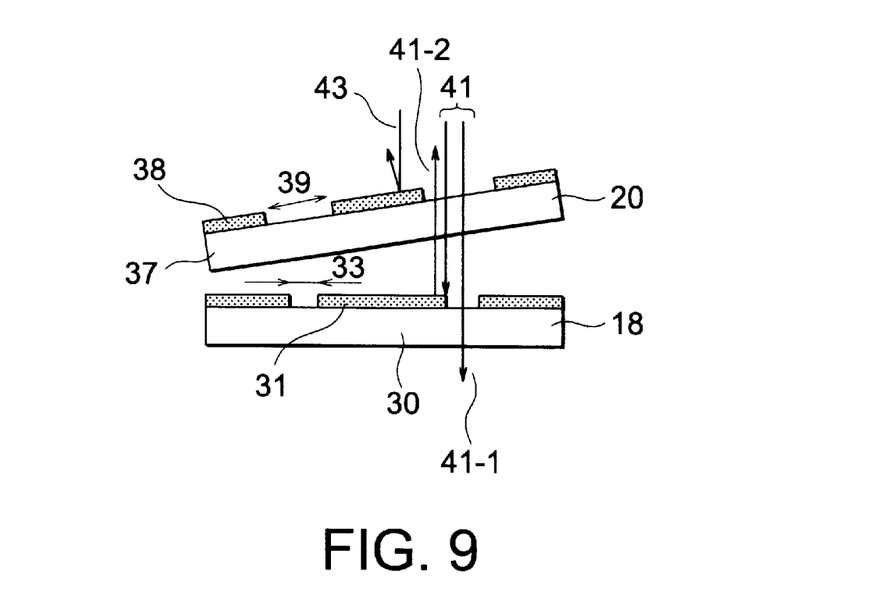
FIG. 9 is a sectional view of a projection mask and a reflection mask used in the apparatus illustrated in FIG. 8.

Referring to FIG. 9, the reflection mask 20 comprises a mask substrate 37 and a reflection film 38 deposited thereon. The mask substrate 37 is made of a material which transmits the laser beam. The reflection film 38 is made of a material having a reflectance of 70% or more with respect to the laser beam. The reflection film 38 is patterned to have a plurality of apertures 39. Alternatively, the reflection mask 20 may comprises a patterned substrate made of a material having a reflectance of 70% or more with respect to the laser beam. As illustrated in FIG. 8 also, the reflection mask 20 is arranged in anti-parallel to the projection mask 18 so that a reflected light beam reflected by the reflection mask 20 does not return to the optical system 12.

When the laser beam $L_O$ is incident to the reflection mask 20, a part of the laser beam $L_O$ is transmitted through the aperture 39 of the reflection mask 20 towards the projection mask 18 as the transmitted laser beam 41 while the other part of the laser beam $L_O$ is reflected by the reflection film 38 of the reflection mask 20 as a reflected laser beam 43. The transmitted laser beam 41 is transmitted through the aperture 33 of the projection mask 18 towards the projection lens 13 as the passing laser beam 41-1 on one hand, and is reflected by the metal film 31 of the projection mask 18 as the reflected laser beam 41-2 to return to the optical system 12 on the other hand. Each aperture 39 of the reflection mask 20 has a size such that the passing laser beam 41-1 is not substantially influenced by scattering and reflection at an end of the reflection film 38 and that production of the reflected light beam 41-2 reflected by the projection mask 18 is minimized to suppress the damage caused by the reflected light beam 41-2 to the optical system 12.

The reflection mask 20 may comprise a mechanism for suppressing an increase in temperature of the reflection mask 20 by the use of water or liquid nitrogen.

Fourth Embodiment

Figure 10:
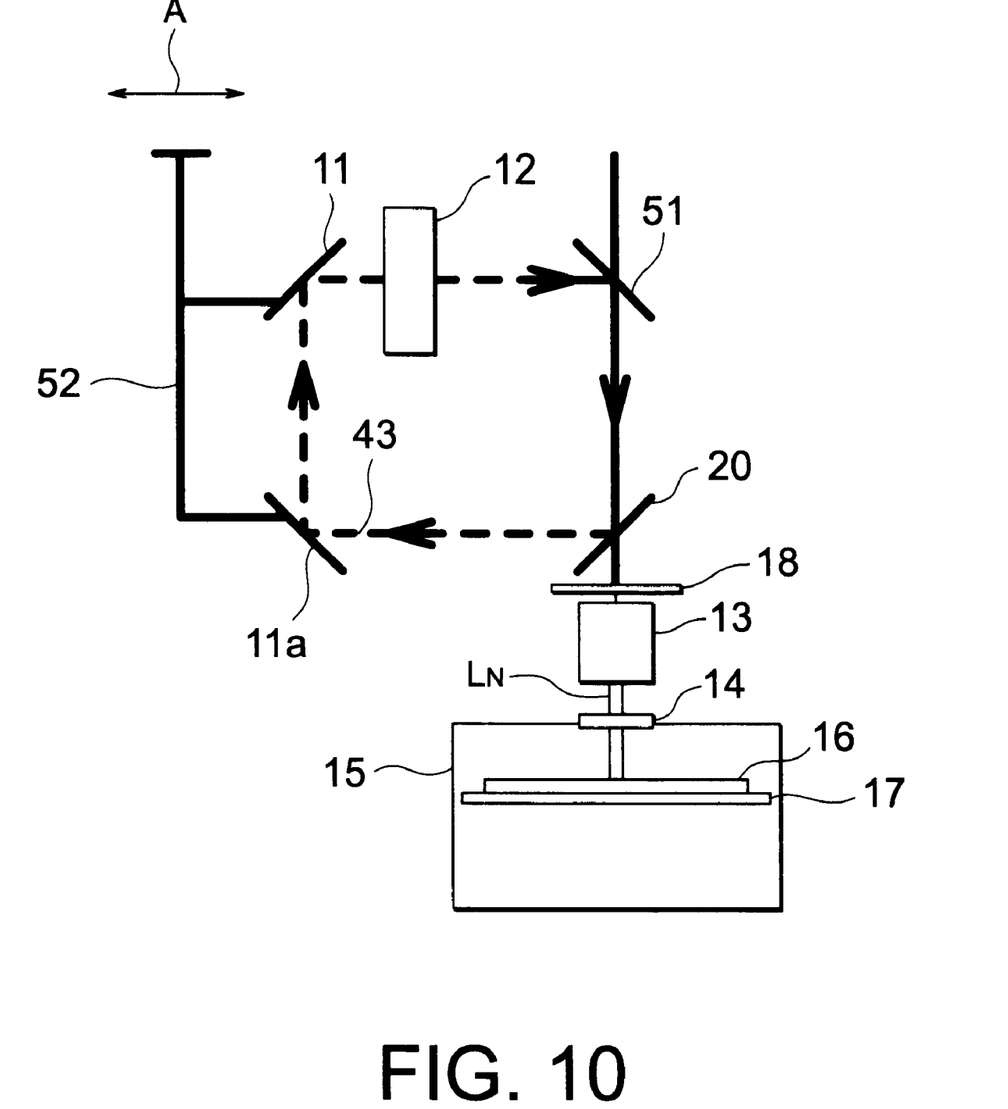
FIG. 10 schematically shows a semiconductor thin film producing apparatus according to a fourth embodiment of this invention.

Referring to FIG. 10, a semiconductor thin film producing apparatus according to a fourth embodiment of this invention will be described. The apparatus in this embodiment is similar in structure to that of the third embodiment except that the reflected light beam 43 reflected by the reflection mask 20 is irradiated again to the substrate 16. Specifically, the apparatus further comprises a halftone mirror 51 and an additional total reflection mirror 11a. By arranging the total reflection mirror 11, the halftone mirror 51, the reflection mirror 20, and the additional total reflection mirror 11a in a positional relationship illustrated in FIG. 10, the reflected light beam 43 reflected by the reflection mask 20 is returned to the optical path for use in laser irradiation onto the substrate 16. The apparatus further comprises a moving unit 52 for changing the locations of the total reflection mirrors 11 and 11a in a direction depicted by an arrow A to adjust the distance over which the reflected light beam 43 travels before it is irradiated again onto the substrate 16. In order to trim the beam profile of the reflected light beam 43, another optical system (not shown) may be inserted at a position before the reflected light beam 43 returns to the optical path.

Now, several specific examples will be described.

FIRST EXAMPLE

In a first example, the apparatus illustrated in FIG. 6 (second embodiment) was used. The laser oscillator was a XeCl laser and the laser beam had a wavelength of 308 nm. The laser beam $L_O$ reflected by the total reflection mirror 11 was shaped by the optical system 12 comprising a homogenizer into a size of 50×50 mm². The laser beam $L_O$ passed through the absorption mask 19 and was thereafter irradiated onto the projection mask 18. The projection mask 18 was provided with the mask pattern including a plurality of slits, 50 in number, arranged at intervals of 1 mm. Each slit had a width of 5 $\mu$m and a length of 50 mm. The laser beam $L_O$ was shaped through the projection mask 18 into a narrow beam $L_N$ in accordance with the above-mentioned mask pattern. The narrow beam $L_N$ was reduction-projected by the projection lens 13 into a half width and a half length and irradiated onto the substrate 16. As a result, a plurality of laser beams, 50 in number, each having a width of 2.5 $\mu$m and a length of 25 mm were irradiated at intervals of 500 $\mu$m. The laser irradiation was carried out with the energy of 400 mJ/cm² on the substrate 16. On the projection mask 18, the energy was 100 mJ/cm². This is because the laser beams were reduced in sectional area into ¼ through the projection mask 18. The substrate 16 was formed by depositing a silicon oxide film and an amorphous silicon film on a glass substrate of 300×350 mm². In the substrate 16, the irradiation area which can be simultaneously irradiated is 25×25 mm² corresponding to ¼ of 50×50 mm². Hereinafter, the irradiation area of 25×25 mm² will be referred to as a block. In order to irradiate an entire surface of the substrate 16, the block was changed 168 times. In order to grow a crystalline silicon on the substrate 16 in a lateral direction for the length of 500 $\mu$m corresponding to the intervals of the slits, the substrate stage 17 was shifted 500 times stepwise by 1 $\mu$m. As a result, in order to irradiate the entire surface of the substrate 16 by the laser beam, laser irradiation was carried out 84000 times (=168×500). Even after such a large number of times of irradiation, no abnormal change was observed in the projection mask 18.

The absorption mask 19 was patterned to have a plurality of slits having a width of 100 $\mu$m and arranged at intervals of 1 mm to overlap the pattern formed in the projection mask 18. In absence of the absorption mask 19, the most part of the laser beam, i.e., 99.5% except the part transmitted through the projection mask 18 returns as the reflected light beam to the optical system 12 comprising the homogenizer. On the other hand, by inserting the absorption mask 19 as described above, the laser beam returning to the optical system 12 can be suppressed to 9.5%. As a result, the optical system 12 can be protected without decreasing the resolution of the laser beam passing through the projection mask 18.

SECOND EXAMPLE

In a second example, the apparatus illustrated in FIG. 8 (third embodiment) was used. The second example was similar to the first example except that the absorption mask 19 was replaced by the reflection mask 20 inclined by an angle of 3° with respect to the projection mask 18. With this structure, the reflected light beam was returned in a direction deviated from the optical system 12 so that the optical system 12 is prevented from being damaged. The reflected light beam was absorbed by an absorber (not shown).

THIRD EXAMPLE

In a third example, the apparatus illustrated in FIG. 10 (fourth embodiment) was used. The reflection mask 20 was inclined by 45° with respect to the projection mask 18. The distance between the reflection mask 20 and the additional total reflection mirror 11' was equal to 3 m. The distance between the total reflection mirrors 11 and 11' was equal to 1.5 m. Thus, the distance over which the laser beam 43 reflected by the reflection mask 20 travels before it returns to the reflection mask 20 was equal to 9 m. Since the laser beam has a traveling speed of $3\times10^8$ m/s, one round of circulation requires a time period of 30 ns. Thus, after lapse of 30 ns following irradiation of a first laser beam onto the substrate 16, a second laser beam is irradiated onto the substrate 16. Therefore, laser irradiation was repeatedly carried out in a short cycle smaller than a pulse frequency of the laser oscillator. In addition, the energy could efficiently be utilized.

As described above, according to this invention, in the semiconductor thin film producing apparatus for irradiating the semiconductor thin film with the laser beam corresponding to the mask or aperture pattern formed in the mask to reform the semiconductor thin film, the mask is made of the material having a reflectance of 70% or more with respect to the laser beam. With this structure, it is possible to improve the durability of the mask against the laser beam and to carry out a large number of laser irradiation without damaging the mask. Although the reflected light beam is produced because such a high-reflectance material is used as the mask material, the optical system is prevented from being damaged by the reflected light beam by the use of the absorption mask or the reflection mask. In addition, by recycling the reflected light beam reflected by the reflection mask, repeated irradiation at time intervals can be carried out. This contributes to effective crystallization. As a result, the efficiency of use of the laser energy is improved.

What is claimed is:

1. A semiconductor thin film producing apparatus for irradiating a semiconductor thin film by a laser beam through an aperture pattern formed in a mask to reform said semiconductor thin film, wherein said mask has a reflecting surface having a reflectance not smaller than 70% with respect to the laser beam emitted from a XeCl excimer laser.

2. A semiconductor thin film producing apparatus as claimed in claim 1, further comprising a cooling mechanism for cooling said mask.

3. A semiconductor thin film producing apparatus as claimed in claim 1, wherein said mask comprises a substrate material and a mask material formed on said substrate material, said mask material having the aperture pattern and the reflecting surface having said reflectance not smaller than 70% with respect to said laser beam, said substrate material transmitting to said semiconductor thin film the laser beam which is transmitted through the aperture pattern formed in said mask material.

4. A semiconductor thin film producing apparatus as claimed in claim 3, further comprising a cooling mechanism for cooling said mask.

5. A semiconductor thin film producing apparatus as claimed in claim 3, wherein said mask further comprises a transmitting film formed on said substrate material with said mask material interposed between said substrate material and said transmitting film.

6. A semiconductor thin film producing apparatus as claimed in claim 1, further comprising at least one absorbing substrate arranged at a position before said laser beam is irradiated onto said mask, said at least one absorbing substrate being for locally absorbing said laser beam.

7. A semiconductor thin film producing apparatus as claimed in claim 6, said at least one absorbing substrate is furthermore for absorbing a reflected beam which is reflected by the reflecting surface of said mask when said laser beam is irradiated onto the reflecting surface of said mask.

8. A semiconductor thin film producing apparatus as claimed in claim 1, further comprising a reflecting substrate arranged at a position such that it is able to reflect a portion of said laser beam before said laser beam is irradiated onto said mask, and anti-parallel to said mask, said reflecting substrate having a reflecting surface having a reflectance of 70% or more with respect to said laser beam for locally reflecting said laser beam as a reflected beam when said laser beam is irradiated onto the reflecting surface of said reflecting substrate.

9. A semiconductor thin film producing apparatus as claimed in claim 8, further comprising a mechanism for returning said reflected beam to an optical path of said laser beam.

10. A semiconductor thin film producing apparatus as claimed in claim 9, further comprising an optical system arranged in a return route through which said reflected beam is returned to said optical path.

11. A semiconductor thin film producing apparatus as claimed in claim 9, further comprising a mechanism for freely changing the length of a return route through which said reflected beam is returned to said optical path.

12. A semiconductor thin film producing apparatus as claimed in claim 8, wherein said reflecting surface of said reflecting substrate reflects light in a direction away from said mask.

13. A semiconductor thin film producing apparatus for irradiating a semiconductor thin film by a laser beam through an aperture pattern formed in a mask to reform said semiconductor thin film, wherein said mask has a reflecting surface having a reflectance not smaller than 70% with respect to said laser beam, wherein said mask comprises a substrate material and a mask material formed on said substrate material, said mask material having the aperture pattern and the reflecting surface having said reflectance not smaller than 70% with respect to said laser beam, said substrate material transmitting to said semiconductor thin film the laser beam which is transmitted through the aperture pattern formed in said mask material, and wherein said mask further comprises a transmitting film formed on said substrate material with said mask material interposed between said substrate material and said transmitting film.

14. A semiconductor thin film producing apparatus for irradiating a semiconductor thin film by a laser beam through an aperture pattern formed in a mask to reform said semiconductor thin film, wherein said mask has a reflecting surface having a reflectance not smaller than 70% with respect to said laser beam, said semiconductor thin film producing apparatus further comprising at least one absorbing substrate arranged at a position before said laser beam is irradiated onto said mask, said at least one absorbing substrate being for locally absorbing said laser beam.

15. A semiconductor thin film producing apparatus as claimed in claim 14, said at least one absorbing substrate is furthermore for absorbing a reflected beam which is reflected by the reflecting surface of said mask when said laser beam is irradiated onto the reflecting surface of said mask.

16. A semiconductor thin film producing apparatus for irradiating a semiconductor thin film by a laser beam through an aperture pattern formed in a mask to reform said semiconductor thin film, wherein said mask has a reflecting surface having a reflectance not smaller than 70% with respect to said laser beam, said semiconductor thin film producing apparatus further comprising a reflecting substrate arranged at a position such that it is able to reflect a portion of said laser beam before said laser beam is irradiated onto said mask, and anti-parallel to said mask, said reflecting substrate having a reflecting surface having a reflectance of 70% or more with respect to said laser beam for locally reflecting said laser beam as a reflected beam when said laser beam is irradiated onto the reflecting surface of said reflecting substrate.

17. A semiconductor thin film producing apparatus as claimed in claim 16, further comprising a mechanism for returning said reflected beam to an optical path of said laser beam.

18. A semiconductor thin film producing apparatus as claimed in claim 17, further comprising an optical system arranged in a return route through which said reflected beam is returned to said optical path.

19. A semiconductor thin film producing apparatus as claimed in claim 17, further comprising a mechanism for freely changing the length of a return route through which said reflected beam is returned to said optical path.

20. A semiconductor thin film producing apparatus as claimed in claim 16, wherein said reflecting surface of said reflecting substrate reflects light in a direction away from said mask.

* * * * *